United States Patent
Bueyuekgoez et al.

(10) Patent No.: US 10,129,987 B2
(45) Date of Patent: Nov. 13, 2018

(54) CIRCUIT CARRIER AND A METHOD FOR PRODUCING A CIRCUIT CARRIER

(71) Applicant: Robert Bosch GmbH, Stuttgart (DE)

(72) Inventors: Harun Bueyuekgoez, Pfullingen (DE);
Roland Gerstner, Reutlingen (DE);
Josef Weber, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 32 days.

(21) Appl. No.: 15/550,086

(22) PCT Filed: Dec. 21, 2015

(86) PCT No.: PCT/EP2015/080712
§ 371 (c)(1),
(2) Date: Aug. 10, 2017

(87) PCT Pub. No.: WO2016/128096
PCT Pub. Date: Aug. 18, 2016

(65) Prior Publication Data
US 2018/0027667 A1  Jan. 25, 2018

(30) Foreign Application Priority Data

Feb. 13, 2015 (DE) .................. 10 2015 202 669

(51) Int. Cl.
| | |
|---|---|
| *H05K 1/03* | (2006.01) |
| *H05K 3/10* | (2006.01) |
| *H05K 3/46* | (2006.01) |
| *H05K 3/40* | (2006.01) |
| *H05K 1/11* | (2006.01) |
| *H05K 1/02* | (2006.01) |

(52) U.S. Cl.
CPC ......... *H05K 3/4629* (2013.01); *H05K 1/0206* (2013.01); *H05K 1/115* (2013.01); *H05K 3/4046* (2013.01); *H05K 1/0204* (2013.01); *H05K 2201/0376* (2013.01); *H05K 2201/10416* (2013.01)

(58) Field of Classification Search
CPC .......................... H05K 1/0306; H05K 3/107
USPC ........................................................ 174/265
See application file for complete search history.

(56) References Cited

U.S. PATENT DOCUMENTS

| | | | | |
|---|---|---|---|---|
| 7,285,730 | B2 * | 10/2007 | Furukuwa | ........... H01L 23/3735 174/255 |
| 2005/0029012 | A1 * | 2/2005 | De La Prieta | .......... B32B 18/00 174/256 |
| 2008/0230963 | A1 | 9/2008 | Sung | |

FOREIGN PATENT DOCUMENTS

| | | |
|---|---|---|
| DE | 2306236 | 8/1974 |
| EP | 0627875 | 12/1994 |

OTHER PUBLICATIONS

International Search Report for Application No. PCT/EP2015/080712 dated Mar. 16, 2016 (English Translation, 2 pages).

* cited by examiner

*Primary Examiner* — Jeremy C Norris
(74) *Attorney, Agent, or Firm* — Michael Best & Friedrich LLP

(57) ABSTRACT

The invention relates to a circuit carrier (1) comprising a plurality of inorganic substrate layers (1.1) that have partial metallizations (1.2, 1.3, 1.4, 1.5, 1.6) for the purpose of electrical and/or thermal conduction, and to a corresponding method for producing such a circuit carrier (1). According to the invention, at least one partial metallization is made in the form of an insert (1.2) that fills a corresponding shaped hole (Continued)

(1.7) introduced into one of said inorganic substrate layers (1.1).

9 Claims, 3 Drawing Sheets

CIRCUIT CARRIER AND A METHOD FOR PRODUCING A CIRCUIT CARRIER

BACKGROUND OF THE INVENTION

The invention relates to a circuit carrier and to a method for producing a circuit carrier.

Inorganic circuit carriers, for example low-temperature cofired ceramics (LTCC) are employed primarily as circuit carriers for logic circuits and relatively low circuit powers for use at high temperatures (up to about 300° C.). In the case of heavy currents of more than 20 A to be switched, in the case of conventional layer thicknesses in the range of from 1 to 20 µm, sometimes up to 100 µm, conductive tracks are very wide in order to cause little local intrinsic eating. The intrinsic heating is partly also increased because, in the case of inorganic circuit carriers (for example LTCC technology), metal/glass mixtures with increased resistivity are also used for the production of conductive tracks.

For the production of electrical terminals as outer contacts, which lead out from the substrate, thin conductive tracks on inorganic circuit carriers have the problem that many known connection techniques cannot be employed. For example, welding is not possible because there is too little remeltable material in the contacts.

SUMMARY OF THE INVENTION

The circuit carrier according to the invention has the advantage thereover that a possibility is provided of conducting heavy currents of more than 20 A with acceptable surface utilization in the planes of the circuit carrier. Furthermore, a sufficient amount of metallic material for external contacting of the circuit carrier is advantageously made available on the outer contacts, so that for example welding may be used as a contacting method.

Embodiments of the present invention excavate the insulation material in one or more inorganic substrate layers of the circuit carrier, and insert into these recesses stamped metal parts and/or metal foils as inserted parts which are subsequently electrically contacted. By means of these inserted metal paths, depending on requirements, heavy currents and/or heavily loadable outer contacts can be produced.

Embodiments of the invention provide a circuit carrier having a plurality of inorganic substrate layers that have partial metallizations for electrical and/or thermal conduction. According to the invention, at least one partial metallization is configured as an inserted part which fills a corresponding shaped hole that is introduced into one of the inorganic substrate layers.

Furthermore, a method for producing such a circuit carrier having a plurality of inorganic substrate layers in combination with inserted metal parts is provided. In order to produce one of the inorganic substrate layers, at least one shaped hole for a corresponding inserted part is introduced into an unfired raw material layer. The inserted part is inserted into the shaped hole. The raw material layer with the inserted part is subsequently fired in a thermal process to form the inorganic substrate layer. In order to produce the circuit carrier, a plurality of these inorganic substrate layers are arranged above one another before the firing process.

It is particularly advantageous that the thickness of the metallization configured as an inserted part may correspond to the thickness of the corresponding fired inorganic substrate layer. In this way, the metallization configured as an inserted part can be electrically and/or thermally contacted both on the upper side and on the lower side of the corresponding inorganic substrate layer. The inserted part may, for example, consist of a metal and/or a metal alloy, preferably copper and/or a copper alloy. The metallization configured as an inserted part may be used as an outer contacting and/or as a power contacting, for example, so that even heavy currents of much more than 20 A can be carried. Embodiments of the circuit carrier according to the invention may therefore be used in vehicles or static systems for electrical power end stages with integrated logic.

In one advantageous configuration of the circuit carrier according to the invention, at least one further partial metallization may be configured as a surface metallization that is arranged on an upper side and/or lower side of one of the inorganic substrate layers. In this case, the at least one surface metallization may be configured as an upper side metallization and/or as a lower side metallization and/or as an inner layer metallization of the circuit carrier. These surface metallizations are preferably used for low currents of much less than 20 A, such as may for example be encountered in electronic logic circuits.

In another configuration of the circuit carrier according to the invention, metallizations formed on different inorganic substrate layers may be electrically and/or thermally connected to one another by means of at least one through-contact.

In one advantageous configuration of the method according to the invention, the raw material layer may be configured to be higher than the inserted part, wherein the shaped hole may be filled up after the insertion of the inserted part with a filler material which is vaporized while the thermal process is being carried out. In this way, it is advantageously possible to prevent the raw material of the substrate layer flowing over the inserted part and reducing the effective contact area.

The thermal process may be preferably configured as a constraint sintering process in which material shrinkage is restricted to the thickness of the raw material layer, so that the inorganic substrate layer is thinner than the material layer. The thickness of the raw material layer is advantageously dimensioned in such a way that the thickness of the inorganic substrate layer corresponds to the thickness of the inserted part after the firing process.

Exemplary embodiments of the invention are represented in the drawings and will be explained in more detail in the description below. In the drawings, references which are the same denote components or elements which have the same or comparable functions.

DETAILED DESCRIPTION

Figure 1:
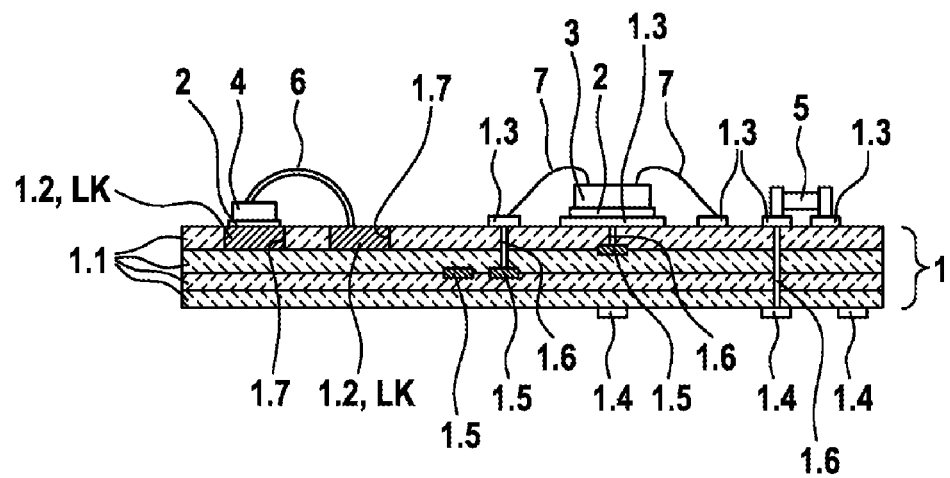
FIG. 1 shows a schematic sectional representation of a first exemplary embodiment of a circuit carrier according to the invention.
Figure 2:
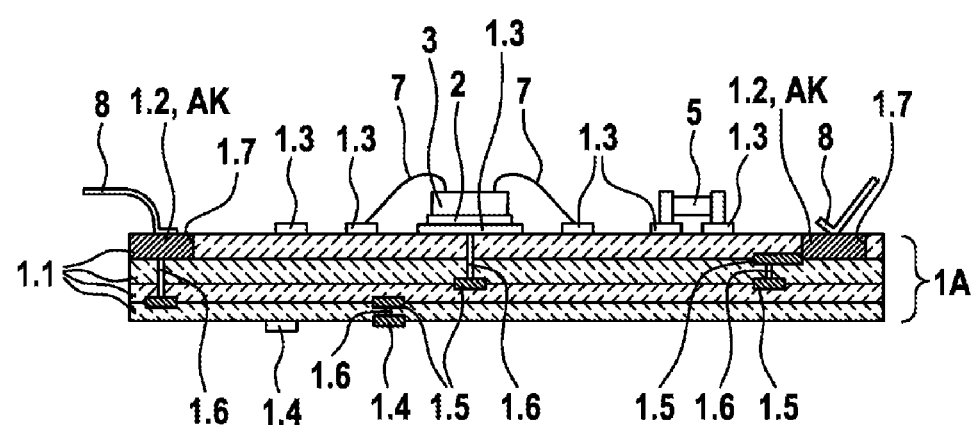
FIG. 2 shows a schematic sectional representation of a second exemplary embodiment of a circuit carrier according to the invention.
Figure 3:
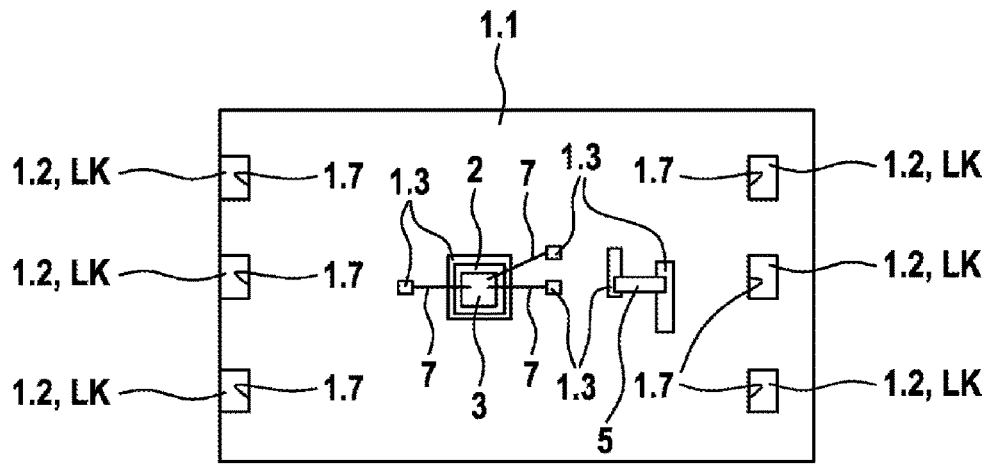
FIG. 3 shows a schematic plan view of the circuit carrier according to the invention of FIG. 2

As can be seen from FIGS. 1 to 3, the represented exemplary embodiments of circuit carriers 1, 1A according to the invention respectively comprise a plurality of inorganic substrate layers 1.1 that have partial metallizations 1.2, 1.3, 1.4, 1.5, 1.6 for electrical and/or thermal conduction. According to the invention, at least one partial metallization is configured as an inserted part 1.2 which fills a corresponding shaped hole 1.7 that is introduced into one of the inorganic substrate layers 1.1.

The circuit carriers 1, 1A represented in FIGS. 1 to 3 respectively show an exemplary embodiment with four inorganic substrate layers 1.1, which are preferably configured as LTCC substrate layers. Of course, alternative exemplary embodiments of the circuit carrier according to the invention may also comprise more or fewer than four inorganic substrate layers. On the circuit carriers 1, 1A, in the exemplary embodiments represented, there are respectively a logic circuit 3 and a discrete component 5. As can furthermore be seen in FIG. 1, the first exemplary embodiment of the circuit carrier 1 according to the invention additionally has a power semiconductor 4. The number of components 3, 4, 5 arranged on the circuit carriers 1, 1A is to be understood by way of example. Of course, in alternative exemplary embodiments (not represented) of the circuit carrier according to the invention, any desired number of logic circuits 3 and/or power semiconductors 4 and/or discrete components 5 may be arranged on the circuit carrier. The logic circuits 3, power semiconductors 4 and discrete components 5 may be fastened on the circuit carrier 1, 1A by any desired material 2, for example solder, adhesive, sintering material, etc., and electrically connected on the upper side to any desired surface contacting, for example bonding strips 6, bonding wire 7, soldered leadframe, etc.

The represented exemplary embodiments of the circuit carrier 1, 1A according to the invention consist of a plurality of inorganic insulating substrate layers 1.1, for example ceramic, glass ceramic, glass, etc., which are partially metallized for electrical and thermal conduction, specifically both in the inner layers 1.5 and usually on the upper side 1.3 and lower side 1.4 of the circuit carrier 1, 1A. These metallizations 1.2, 1.3, 1.4, 1.5 arranged in different inorganic substrate layers 1.1 may be electrically and/or thermally connected to one another by means of through-contacts 1.6. The through-contacts 1.6 may, for example, be produced by holes filled with metallic material in the inorganic substrate layers 1.1.

As can furthermore be seen from FIGS. 1 and 2, the thickness of the metallizations configured as inserted parts 1.2 corresponds to the thickness of the corresponding inorganic substrate layer 1.1. In the exemplary embodiments represented, the inserted parts 1.2 consist of copper. As an alternative, the inserted parts may consist of a copper alloy or of other suitable metals and/or metal alloys. The inserted parts 1.2 may be arranged in any desired inorganic substrate layer 1.1 of the circuit carrier 1, 1A, specifically both on the outer edge and in the inner region of the circuit carrier 1, 1A. The inserted parts 1.2 may be used for electrical and/or thermal conduction. In addition or as an alternative, outer contacts 8, logic circuits 3, power semiconductors 4 or discrete components 5 may also be fastened on the inserted parts 1.2, and electrically contacted, by suitable connecting methods.

As can furthermore be seen from FIG. 1, the metallizations configured as inserted parts 1.2 are used in the represented first exemplary embodiment of the circuit carrier 1 according to the invention as power contactings LK and heavy current lines for the power semiconductor 4. In this case, a backside connection 2 of the power semiconductor 4 is produced with a first power contacting LK. The upper side connection of the power semiconductor 4 is produced with a second power contacting LK via a bonding strip 6. As an alternative, a plurality of bonding strips 6 and/or a bonding wire 7 and/or a plurality of bonding wires 7 and/or soldered leadframe may also be used for producing the upper side connection of the power semiconductor 4.

As can furthermore be seen from FIGS. 2 and 3, the metallizations configured as inserted parts 1.2 are used in the represented second exemplary embodiment of the circuit carrier 1A according to the invention as outer contactings AK for the outer contacts 8 of the circuit carrier 1A. In this case, the outer contacts 8 may be connected to the outer contactings AK by means of a suitable connecting method, for example welding.

As can furthermore be seen from FIGS. 1 to 3, at least one further partial metallization 1.3, 1.4, 1.5 is configured as a surface metallization that is arranged on an upper side and/or lower side of one of the inorganic substrate layers 1.1. The surface metallizations are respectively configured in the exemplary embodiments represented as an upper side metallization 1.3, lower side metallization 1.4 or inner layer metallization 1.5 of the circuit carrier 1, 1A. Both in the first and in the second exemplary embodiment of the circuit carrier 1, 1A according to the invention a backside connection 2 of the logic circuit 3 is respectively produced with a surface metallization 1.3. The upper side connection of the logic circuit 3 is produced with further upper side metallizations 1.3 respectively via bonding wires 7. In both exemplary embodiments of the circuit carrier 1, 1A according to the invention, the discrete component 5 is respectively connected to two upper side metallizations 1.3. Of course, alternative exemplary embodiments of the circuit carrier according to the invention may also have more or fewer than two surface metallizations 1.3 for a discrete component 5. The number of surface metallizations 1.3 for a discrete component 5 depends on the number of terminals to be contacted of the discrete component 5.

Figure 4:
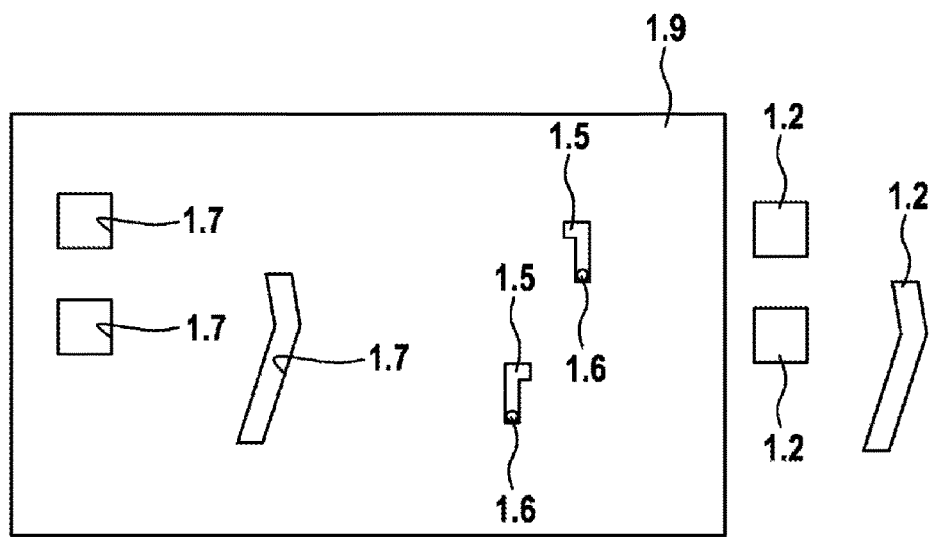
FIG. 4 shows a schematic plan view of a raw material layer for an inorganic substrate layer of a circuit carrier according to the invention after the introduction of shaped holes.
Figure 5:
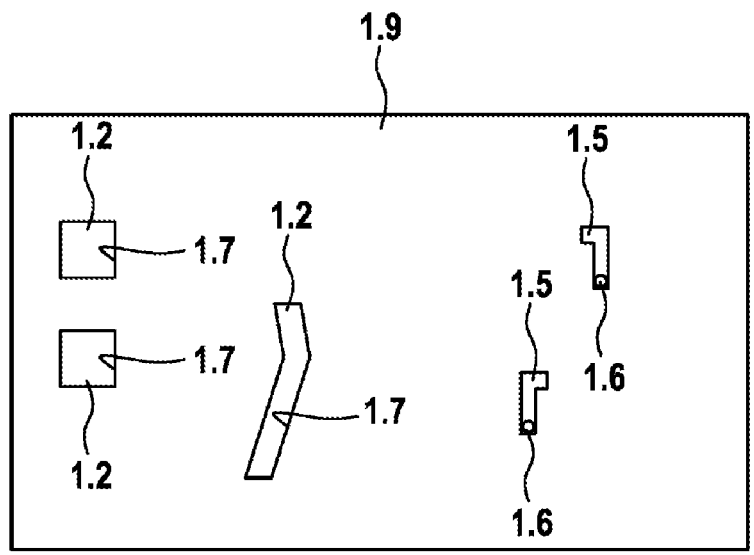
FIG. 5 shows a schematic plan view of the raw material layer of FIG. 4 after the insertion of inserted parts into the shaped holes.

As can furthermore be seen from FIG. 4, in order to produce the circuit carrier 1, 1A according to the invention, shaped holes 1.7 for the inserted parts 1.2 are introduced into the unfired raw material layer 1.9 of an inorganic substrate layer 1.1. The inserted parts 1.2 are then inserted into these shaped holes 1.7, as can be seen in FIG. 5. Furthermore, besides the shaped holes 1.7 for the inserted parts 1.2, holes are also introduced for the through-contacts 1.6 and metallized, and the inner layer metallizations 1.5 are applied. Ideally, a constraint sintering process is used for the firing, so that the material shrinkage is essentially restricted to the thickness of the raw material layer 1.9. Since the thickness of the raw material layer 1.9 then decreases during the firing, while the inserted parts 1.2 essentially maintain their thickness, a filler material 1.8, which is also referred to as a sintering auxiliary, is additionally introduced into the shaped holes 1.7. The filler material 1.8 is vaporized during the firing process. In order to prevent metal oxidation, the firing process may be carried out in an inert gas, for example nitrogen ($N_2$), with a defined amount of reaction gas, for example oxygen (O$_2$). The raw material layer 1.9 is therefore configured to be higher than the inserted part 1.2, and, after the insertion of the inserted part 1.2, the shaped hole 1.7 is filled up with the filler material 1.8, which is vaporized while the thermal process is being carried out. Because of the material shrinkage, the inorganic substrate layer 1.1 is thinner than the raw material layer 1.9, and preferably corresponds to the thickness of the inserted part 1.2.

Figure 6:
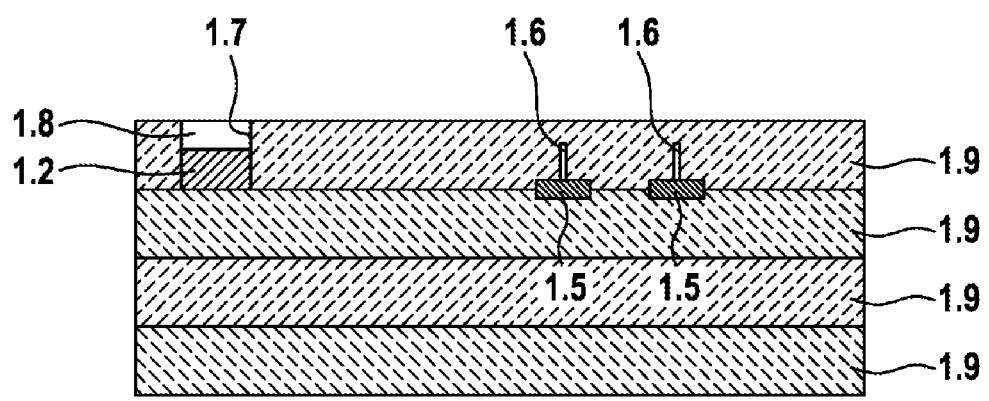
FIG. 6 shows a schematic sectional representation of a third exemplary embodiment of a circuit carrier according to the invention with the raw material layer of FIG. 5 before the thermal process.

As can furthermore be seen from FIG. 6, in order to produce the circuit carrier, a plurality of these raw material layers 1.9 are arranged above one another before the firing process.

Embodiments of the present invention advantageously provide a circuit carrier having metallizations that are configured as inserted parts, and which may be used for example as outer contacting and/or as power contacting and/or heavy current lines, so that even heavy currents of much more than 20 A can be carried. Embodiments of the circuit carrier according to the invention may therefore be used in vehicles or static systems for electrical power end stages with integrated logic.

The invention claimed is:

1. A circuit carrier (1, 1A) having a plurality of inorganic substrate layers (1.1) that have partial metallizations (1.2, 1.3, 1.4, 1.5, 1.6) for electrical and/or thermal conduction, characterized in that at least one of the partial metallizations is configured as an inserted part (1.2) which fills a corresponding shaped hole (1.7) that is introduced into one of the inorganic substrate layers (1.1), characterized in that the one of the partial metallizations configured as an inserted part (1.2) is used as a power contacting (LK) and/or as a heavy current line that conducts currents of more than 20 A in a plane of the circuit carrier (1, 1A) parallel to the plurality of inorganic substrate layers (1.1).

2. The circuit carrier as claimed in claim 1, characterized in that a thickness of the one of the partial metallizations configured as an inserted part (1.2) is equal to a thickness of the corresponding inorganic substrate layer (11).

3. The circuit carrier as claimed in claim 1, characterized in that the inserted part (1.2) consists of a metal and/or a metal alloy.

4. The circuit carrier as claimed in claim 1, characterized in that at least one further partial metallization is configured as a surface metallization that is arranged on an upper side and/or lower side of one of the inorganic substrate layers (1.1).

5. The circuit carrier as claimed in claim 4, characterized in that the surface metallization is configured as an upper side metallization (1.3) and/or as a lower side metallization (14) and/or as an inner layer metallization (1.5) of the circuit carrier (1, 1A).

6. The circuit carrier as claimed in claim 1, characterized in that metallizations (1.2, 1.3, 1.4, 1.5) formed on different inorganic substrate layers (1.1) are electrically and/or thermally connected to one another by at least one through-contact (1.6).

7. A method for producing a circuit carrier (1, 1A) having a plurality of inorganic substrate layers (1.1) as claimed in claim 1, the method comprising in order to produce one of the inorganic substrate layers (11), introducing at least one shaped hole (1.7) for a corresponding inserted part (1.2) into an unfired raw material layer (1.9), and inserting the inserted part (1.2) into the shaped hole (1.7), and firing the raw material layer (1.9) with the inserted part (1.2) in a thermal process to form the inorganic substrate layer (1.1), characterized in that the raw material layer (1.9) is configured to be higher than the inserted part (1.2), wherein the shaped hole (1.7) is filled up after the insertion of the inserted part (1.2) with a filler material (1.8) which is vaporized while the thermal process is being carried out.

8. The method as claimed in claim 7, characterized in that the thermal process is a constraint sintering process in which material shrinkage is essentially restricted to the thickness of the raw material layer (1.9), so that the inorganic substrate layer (1.1) is thinner than the material layer (1.9).

9. The circuit carrier as claimed in claim 1, characterized in that the inserted part (1.2) consists of copper and/or a copper alloy.

* * * * *